US005450229A

United States Patent [19]
Wiesenfeld

[11] Patent Number: 5,450,229
[45] Date of Patent: Sep. 12, 1995

[54] OPTICAL WAVELENGTH SHIFTER WITH REDUCED GAIN RECOVERY TIME

[75] Inventor: Jay M. Wiesenfeld, Lincroft, N.J.

[73] Assignee: AT&T Corp., Murray Hill, N.J.

[21] Appl. No.: 128,958

[22] Filed: Sep. 29, 1993

[51] Int. Cl.$^6$ .............................................. G02B 6/26
[52] U.S. Cl. .................................... 359/238; 359/243; 359/244
[58] Field of Search ................ 359/238, 243, 244, 341, 359/344

[56] References Cited

U.S. PATENT DOCUMENTS

| | | | |
|---|---|---|---|
| 5,015,054 | 5/1991 | Chaffee | 350/96.15 |
| 5,111,326 | 5/1992 | Ball | 359/244 |
| 5,301,054 | 4/1994 | Huber et al. | 359/132 |

OTHER PUBLICATIONS

Agrawal, G. P., and Dutta, N. K., *Long-Wavelength Semiconductor Lasers*, Van Nostrand Reinhold Company, Inc., New York, 1986, p. 116–122, 220–228.

Durhuus, T., Pedersen, R. J. S., Mikkelsen, B., Stubkjaer, K. E., Oberg, M., and Nilsson, S., "Optical Wavelength Conversion Over 18 nm At 2.5 Gb/s By DBR-Laser," IEEE Photonics Technology Letters, vol. 5, No. 1, Jan. 1993, pp. 86–88.

Glance, B., Wiesenfeld, J. M., Koren U., Gnauck, A. H., Presby, H. M., and Jourdan, A., "High Performance Optical Wavelength Shifter," Electronics Letters, vol. 28, No. 18, Aug. 27, 1992, pp. 1714–1715.

Joergensen, C., Durhuus, T., Braagaard, C., Mikelsen, B., and Stubkjaer, K. E., "4 Gb/s Optical Wavelength Conversion Using Semiconductor Optical Amplifiers," IEEE PHotonics Technology Letters, vol. 5, No. 6, Jun. 1993, pp. 657–660.

Ludwig, R., and Raybon, G., "BER-Measurements of Frequency Converted Signals Using Four-Wave-Mixing in a Semiconductor Laser Amplifier at 1, 2.5, 5 and 10 Gbit/s," Paper submitted to Electronics Letters, 1993.

Mikkelsen, B., Vaa, M., Pedersen, R. J., Durhuus, T, Joergensen, C, Braagaard, C., Storkfelt, N., Stubkjaer, K. E., Doussiere, P., Garabedian, G., Graver, C., Derouin, E., Fillion, T., and Klenk, M., "20 Gbit/s Polarisation Insensitive Wavelength Conversion in Semiconductor Optical Amplifiers," Post–deadline Paper No. TLP 12.6, ECOC 1993, Montreux, Switzerland, Sep. 1993, pp. 73–76.

Saitoh, Tadashi, and Mukai, Takaai, "Recent Progress in Semiconductor Laser Amplifiers," Journal of Lightwave Technology, vol. 6, No. 11, Nov. 1988, pp. 1656–1664.

Valiente, I, Simon, J. C., and Le Ligne, M., "Theoretical Analysis of Semiconductor Optical Amplifier Wavelength Shifter," Electronics Letters, vol. 29, No. 5, Mar. 4, 1993, pp. 502–503.

Wiesenfeld, J. M., and Glance, B., "Cascadability and Fanout of Semiconductor Optical Amplifier Wavelength Shifter," IEEE Photonics Technology Letters, vol. 4, No. 10, Oct. 1992, pp. 1168–1171.

*Primary Examiner*—Mark Hellner

[57] ABSTRACT

A method and apparatus for wavelength shifting an intensity-modulated optical signal are provided. The present invention utilizes an intensity-modulated first optical signal at a first wavelength, a second optical signal at a second wavelength and an optical amplifier with a gain which varies with the intensity modulation of the first optical signal. The optical amplifier receives and amplifies the first and second signals such that variations in the intensity modulation of the first optical signal alter the optical amplifier gain, producing an amplified second optical signal with corresponding intensity variations. In accordance with the invention the power level of the second optical signal is adjusted to reduce the amplifier gain recovery time and thereby reduce the rise time of the intensity variations of the amplified second optical signal. Optical wavelength shifting by amplifier gain compression is thereby made possible at bit rates of 10 Gbits/sec or higher.

26 Claims, 5 Drawing Sheets

OPTICAL WAVELENGTH SHIFTER WITH REDUCED GAIN RECOVERY TIME

BACKGROUND OF THE INVENTION

1. Field of the Invention

The present invention relates generally to improvements in optical communication systems. More particularly, the present invention relates to improvements in optical amplifier wavelength shifters.

2. Description of Prior Art

In optical communication systems, it is often desirable to shift an optical signal from one wavelength to another. For example, wavelength shifting can significantly increase total system capacity of wavelength division multiplexed (WDM) optical systems, which simultaneously utilize several optical carrier signal wavelengths modulated by different data streams. A large high-capacity WDM optical network may therefore be constructed by interconnecting smaller WDM optical networks through wavelength shifters. The same set of carrier signal wavelengths are used within each of the smaller networks, while wavelength shifting of the optical carrier signals passing between the smaller networks allows frequency reuse of the available optical bandwidth and thereby increased system capacity. See U.S. patent application Ser. No. 07/880,728 entitled "Optical Wavelength Shifter" and assigned to the assignee of the present invention.

As another example, optical signals may be wavelength shifted to overcome source bandwidth limitations which restrict the range of possible carrier signal wavelengths. A wavelength shifter permits use of carrier signals with wavelengths outside of the optical source tuning range by shifting a modulated optical carrier signal from a first wavelength to a second wavelength. The first wavelength is generally the output carrier signal from the optical source, while the second wavelength may be any other desired wavelength within the operating bandwidth of the wavelength shifter. Wavelength shifting is also important in other optical applications, including optical switching, optical logic elements, signal regeneration, time demultiplexing and optical taps.

Wavelength shifting, also commonly referred to as wavelength or frequency conversion, may be carried out using a number of available techniques. One such technique is optical four-photon mixing. Four-photon mixing is a nonlinear optical process which produces mixing products at different wavelengths by mixing an input optical signal with one or more higher power optical signals, or pump signals, in a nonlinear mixing medium such as a semiconductor laser amplifier or a length of dispersion shifted optical fiber. Four-photon mixing can be used in principle to wavelength shift signals at bit rates of up to about 100 Gbits/sec or more, and has been demonstrated at bit rates of about 10 Gbits/s. However, four-photon mixing suffers from a number of drawbacks, including dependence of mixing efficiency on relative input and pump signal polarization, sensitivity to input and pump signal power and wavelength, possible output signal interference from undesired mixing products and low conversion efficiency.

Another known technique uses semiconductor optical amplifier gain compression to produce the complement of intensity modulation of a first optical signal at a given wavelength on an unmodulated continuous wave (CW) second optical signal at a different wavelength. The first optical signal is often referred to as the pump signal, while the unmodulated second signal is referred to as the probe signal. The intensity modulation on the pump signal varies the optical amplifier gain and in effect modulates the amplification of the previously unmodulated probe signal, such that the complement of the intensity modulation on the pump signal also appears on the amplified probe signal. See B. Glance et al., "High Performance Optical Wavelength Shifter", Electronics Letters, Vol. 28, No. 18, Aug. 27, 1992. Wavelength shifting via optical amplifier gain compression provides a number of advantages. These include potential polarization independence, reduced sensitivity to pump and probe signal parameters such as power level and wavelength, and conversion gain. See J. Wiesenfeld and B. Glance, "Cascadability and Fanout of Semiconductor Optical Amplifier Wavelength Shifter," IEEE Photonics Technology Letters, Vol 4, No. 10, October 1992.

Presently available gain compression wavelength shifting techniques typically utilize a probe signal with a low power relative to the intensity-modulated pump signal. A relatively low power probe signal is used because it has been recognized that a degradation in the wavelength shifter output extinction ratio may result if the probe signal power is increased to a point at which it begins to saturate the amplifier gain. The extinction ratio, also known as contrast ratio, refers to the ratio of power corresponding to a logic level one, or "mark power", to power corresponding to a logic level zero, or "space power", in the data stream of the wavelength shifted signal. The extinction ratio is reduced by an increase in probe signal power because the fluctuation in amplifier gain resulting from the intensity modulation of the pump signal is reduced in the presence of a higher power gain-compressing probe signal. A probe power level of about $-15.0$ dBm or less at the amplifier input facet (dBm refers to dB relative to 1.0 mW) is therefore typically used for the probe signal. A maximum bit rate of about 4.0 Gbits/s has been demonstrated using a probe signal at a power level in this range. See C. Joergensen et al., "4 Gb/s Optical Wavelength Conversion Using Semiconductor Optical Amplifiers", IEEE Photonics Technology Letters, Vol.5, No.6, June 1993.

The achievable bit rate in gain compression wavelength shifters is limited by the gain recovery time, or carrier lifetime, of the optical amplifier. In an optical amplifier, the gain recovery time is dependent, in part, on the amplifier internal photon density. When the pump signal makes a transition from low to high power, the high pump power saturates the amplifier, reducing the gain of the amplifier for the probe signal but producing a high internal photon density. The high photon density leads to a rapid gain recovery time, and a fast probe signal transition, or fall time, from high to low amplification. However, when the pump signal makes a transition from high to low power, the internal photon density in the amplifier is greatly reduced, leading to a slower gain recovery time, and hence a slow probe signal transition, or rise time, from low to high amplification. The rise time of the intensity modulation reproduced on the probe signal is therefore slow, and limits the maximum speed or bit rate capacity of the wavelength shifter. For example, the minimum achievable output rise times are presently about 200 to 250 picoseconds for InGaAsP semiconductor optical amplifiers operating near 1.5 μm, resulting in a maximum bit rate of about 4.0 Gbits/sec for these devices. In order to increase the capacity of optical systems using wavelength shifters, further reductions in output signal rise times are needed.

Although it may be known that an increase in the internal photon density in a semiconductor laser or amplifier will lead to a shorter carrier lifetime, it has not heretofore been considered acceptable to achieve such an increase in photon density by increasing the probe signal input power. Other techniques for increasing internal photon density have been suggested, including the use of specially designed optical amplifiers with large facet reflectivities. For example, in the C. Joergensen et al. article, cited above, an increase in internal photon density is achieved by increasing the facet reflectivity from $5.0 \times 10^{-4}$ to 0.36. The increased reflectivity resulted in a decrease in probe signal modulation rise time from 175 to 60 picoseconds at an optical amplifier bias current of about 70 mA. However, increased reflectivity also produces significant gain ripple and wavelength sensitivity, and is therefore generally not considered a suitable technique for increasing the bit rate capacity of practical broadband wavelength shifters.

As is apparent from the above, a need exists for a method and apparatus which permit higher bit rate optical amplifier wavelength shifting over a broad bandwidth, without significant performance degradation or additional hardware design and implementation costs.

SUMMARY OF THE INVENTION

The present invention provides an improved method and apparatus for wavelength shifting of optical signals using optical amplifier gain compression. The method of the present invention includes the steps of providing an intensity-modulated first optical signal at a first wavelength; providing a second optical signal at a second wavelength; providing an optical amplifier having a gain which varies with the intensity modulation of the first optical signal; applying the first and second optical signals to the optical amplifier; amplifying the first and second optical signals in the optical amplifier such that variations in the intensity of the intensity-modulated first optical signal alter the gain of the optical amplifier to produce an amplified intensity-modulated second optical signal with corresponding complementary intensity variations; and adjusting a power level of the second optical signal applied to the optical amplifier to reduce a transition time of the corresponding variations in intensity of the amplified intensity-modulated second optical signal. The first and second optical signals will also be referred to herein as the pump and probe signals, respectively. By varying the power level of the second optical signal in this manner, the amplifier gain recovery time, and thereby the rise time of the intensity modulation on the amplified second signal, is significantly reduced, such that the wavelength shifter may be used at substantially higher bit rates than heretofore possible.

In accordance with one aspect of the present invention, the step of adjusting the power level of the unmodulated second optical signal includes adjusting the power level of the second optical signal to a level above a 3 dB gain compression point of the optical amplifier. Unmodulated probe signal power levels within this range have typically not been used to increase the maximum throughput bit rate of the wavelength shifter, due to a generally accepted perception that the performance penalty would be too severe due to the probe signal compressing the amplifier gain.

In accordance with another aspect of the present invention, the wavelength of the first optical signal, or pump signal, may be shorter or longer than the wavelength of the second optical signal, or probe signal. Adjustments in probe signal power level may be made in accordance with the present invention to improve the performance of the wavelength shifter regardless of whether the optical signal is shifted to a longer or shorter wavelength.

As a feature of the present invention, the advantages of wavelength shifting using gain compression in optical amplifiers are extended to higher system bit rates. For example, optical system performance is demonstrated herein at bit rates of 10 Gbits/sec. Previous demonstrations, without the improvements of the present invention, had indicated a maximum operating bit rate of about 4 to 5 Gbits/sec.

As another feature of the present invention, an exemplary adjustment of probe signal power level is an increase of several dB over values used in the prior art systems. Additional amplifiers or system hardware therefore may not be necessary to achieve the advantages of the present invention. Even if an additional amplifier is used to boost the probe signal power level, optical communication system performance is considerably improved with a relatively small increase in system design and operating costs.

As an additional feature of the present invention, wavelength shifting by optical amplifier gain compression may be used in high bit rate optical systems which previously could use only other conversion techniques, such as optical four-photon mixing. The disadvantages of these other wavelength shifting or conversion techniques, including polarization dependent mixing efficiency, sensitivity to signal input power and wavelength, possible output signal interference from undesired mixing products, and conversion loss, may now be avoided by using the improved optical wavelength shifting techniques of the present invention.

As a further feature of the present invention, the techniques used to increase the optical amplifier internal photon density, and thereby reduce amplifier gain recovery time and shifted signal rise time, do not produce significant degradation in performance. For example, the gain response of an optical amplifier in accordance with the present invention will typically be less sensitive to signal frequency than that of an amplifier which increases facet reflectivity to increase internal photon density.

As yet another feature of the present invention, the wavelength shifter may be readily implemented as a photonic integrated circuit. The performance improvements provided by the present invention do not require modifications to the optical amplifier itself which might preclude implementation as a photonic integrated circuit. Maximum implementation flexibility is maintained, such that the present invention may be readily utilized in numerous applications.

The above-discussed features, as well as additional features and advantages of the present invention, will become more readily apparent by reference to the following detailed description and accompanying drawings.

DETAILED DESCRIPTION

Figure 1A:
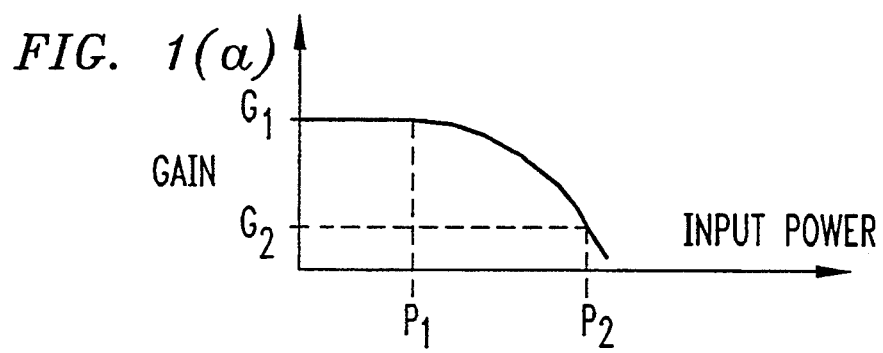
FIG. 1(a) is graphical representation of an exemplary optical amplifier gain characteristic, illustrating variation in amplifier gain as a function of amplifier input power.

The present invention provides a method and apparatus for increasing the bit rate capacity of gain compression optical wavelength shifting primarily by reducing the rise time of shifted signal intensity modulation. Although the following description is primarily directed to a particular type of wavelength shifter, it should be understood that the techniques are applicable more generally to any wavelength shifter based upon gain compression or similar effects in other optical devices. Generally, the present invention uses stimulated recombinations to speed up the rate at which carriers can be moved in and out of the active region of an optical device. Therefore, the present invention may improve the performance of any optical device limited by optical carrier lifetime or gain recovery effects. In addition, the particular arrangement and designation of signals as first or second, pump or probe, and the like, is exemplary and should not be understood to limit the scope of the present invention. Although only a single pump and probe signal are used in many of the embodiments discussed herein, other numbers and arrangements of input optical signals could also be used. For example, several probe signals at different wavelengths could be input into the optical amplifier with a modulated pump to place the complement of the pump modulation on each of the probe signals. Furthermore, the wavelength shifter of the present invention may be used with intensity modulation on both the pump and the probe input signals, for example, in an optical logic element application to provide a shifted output signal with modulation representing the result of a logic function of the pump and probe signal modulation.

Referring now to FIG. 1, the basic operation of an optical amplifier wavelength shifter will be described. As mentioned above, the wavelength shifting is accomplished by amplifying a first and second optical signal within the optical amplifier. The first and second optical signals will be referred to herein as the pump and probe signals, respectively. A typical semiconductor optical amplifier wavelength shifter will utilize two optical signal inputs. The pump signal is typically an intensity-modulated optical signal at an average power level of about $-10.0$ to $-4.0$ dBm at the amplifier input facet. It should be noted that the amplifier input power levels referred to herein may be either levels in optical fiber, couplers, or other devices before the amplifier, or levels at the amplifier input facet. There is generally a certain amount of loss between a point where power can be conveniently measured, such as in the fiber or a coupler before the amplifier, and the amplifier input facet itself. For example, the difference between power levels at the input facet and those in fiber before the amplifier was on the order of 6 dB for the measurements to be described below in conjunction with FIGS. 4, 5, and 6. In prior art systems, the probe signal is typically an unmodulated CW signal with a significantly lower power level, on the order of about $-23.0$ to $-15.0$ dBm at the input facet. The wavelength shifter produces intensity modulation complementary to that of the pump signal on the CW probe signal by simultaneously amplifying both signals.

A semiconductor optical amplifier will typically have a gain characteristic similar to that shown in FIG. 1(a). The exemplary characteristic illustrates the gain of the optical amplifier, in decibels, as a function of the input signal power, in dBm. The gain is defined as the ratio of output signal power to input signal power. Although the amplifier gain curve shown may vary as a function of input signal wavelength, the curves for various other wavelengths are qualitatively similar to the exemplary curve in FIG. 1(a). In general, the amplifier gain remains relatively constant for a range of input power levels. This range is illustrated by the portion of the gain curve between an input power of zero and the point designated $P_1$. For input powers greater than about $P_1$, the amplifier output begins to saturate and the gain begins to compress. At the point $P_2$, the gain is reduced by about 8 to 10 dB. As used herein, output saturation and gain compression both refer to the reduction in amplifier gain resulting at high input signal power levels.

Figure 1B:
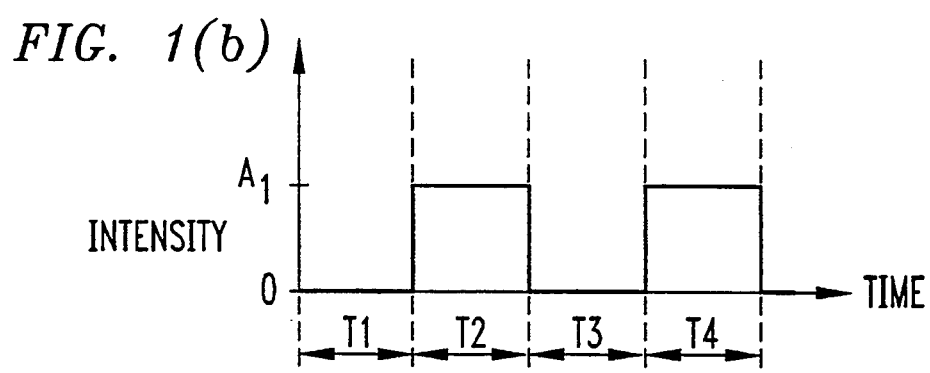
FIG. 1(b) shows the modulation envelope of an exemplary intensity-modulated pump signal used in accordance with the present invention.

The modulation envelope of the exemplary intensity-modulated pump signal shown in FIG. 1(b) is intended to produce variation in optical amplifier gain by varying the pump signal power level. The exemplary pump signal is intensity modulated with a 0101 pattern, using amplitude-shift keyed (ASK) intensity modulation. A logic level zero is indicated by an absence of the carrier signal, as in the bit periods T1 and T3, while a logic level one is indicated by the carrier signal at an intensity $A_1$ of about 0.1 to 5.0 mW at the amplifier output, as in the bit periods T2 and T4. The optical carrier signal is at a first wavelength, and the wavelength shifter shifts this carrier signal to a second wavelength by reproducing a complementary representation of the modulation envelope, in this,exemplary case the 0101 pattern, on a probe signal at a second wavelength.

Figure 1C:
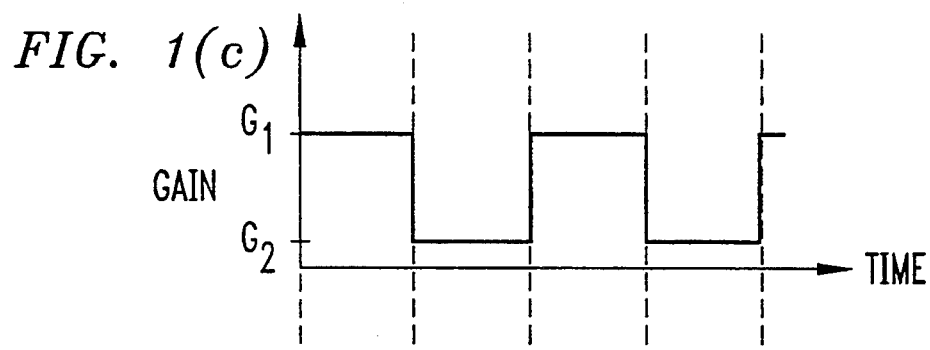
FIG. 1(c) shows the resulting amplifier gain variation when the exemplary intensity-modulated pump signal of FIG. 1(b) is applied to an optical amplifier having the gain characteristic of FIG. 1(a).

Applying the exemplary pump signal of FIG. 1(b) to an optical amplifier having the characteristic shown in FIG. 1(a) will produce variations in the amplifier gain which correspond to the intensity modulation on the pump signal. The variations in amplifier gain produced for an exemplary 0101 pattern are shown in FIG. 1(c). For bit periods T1 and T3, the intensity modulation results in a low level or absence of pump signal power. The pump signal power within bit periods T1 and T3 will thus correspond to a point on the amplifier gain characteristic somewhere in the constant gain region below point $P_1$ in FIG. 1(a). As a result, for periods T1 and T3, the amplifier gain is a constant value of about $G_1$ dB, as shown in FIG. 1(c). For bit periods T2 and T4, however, the intensity modulation is at a logic high level, resulting in significant pump signal power. The pump signal power level at this high modulation level is chosen such that it corresponds to a point within the amplifier gain saturation region, such as point $P_2$ in FIG. 1(a). For bit periods T2 and T4, therefore, the amplifier gain is reduced as a result of the amplifier gain saturation to, for example, a value $G_2$ as shown in FIG. 1(c). The intensity modulation of the pump signal thus produces a corresponding intensity modulation of the amplifier gain, such that the amplifier gain varies as a function of time in accordance with the complement of the intensity modulation pattern of the pump signal.

Figure 1D:
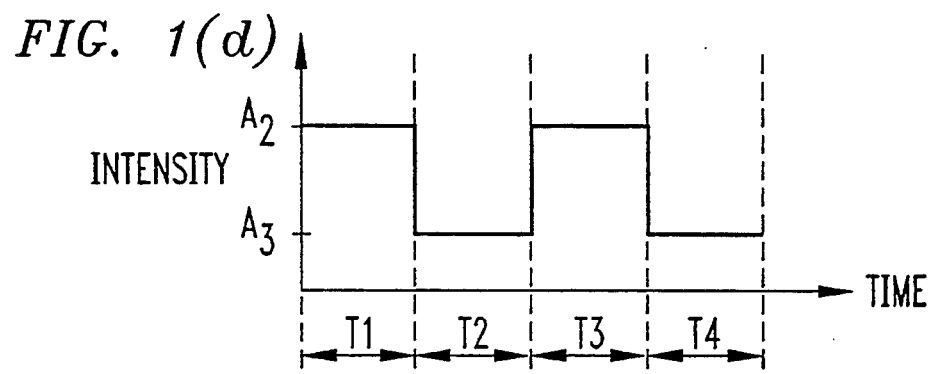
FIG. 1(d) shows the modulation envelope of an exemplary optical probe signal having intensity modulation corresponding to that of the pump signal of FIG. 1(b) as a result of amplification with the pump signal in an optical amplifier having the gain characteristic of FIG. 1(a).

The unmodulated CW probe signal is simultaneously applied to the above-described optical amplifier. The time-varying gain of the amplifier shown in FIG. 1(c) produces a corresponding intensity modulation of the probe signal as it is amplified. For example, in bit periods T1 and T3, the amplifier gain is at a high value of $G_1$, and the amplified probe signal will therefore also have a high intensity value $A_2$, as shown in FIG. 1(d). In bit periods T2 and T4, the amplifier gain as seen by the probe signal is reduced to a low value of $G_2$, and the amplified probe signal therefore has a low intensity value $A_3$. The resultant amplified probe signal has an intensity modulation which corresponds to the complement of the probe signal modulation, in this exemplary case a pattern of 1010, and a different wavelength. The wavelength shifter has thus modulated the complement of the intensity modulation of the pump signal onto the previously unmodulated probe signal at a different carrier signal wavelength. Although the carrier wavelength has been shifted, the data stream modulated onto the carrier remains the exact complement of the pump signal modulating data stream, with corresponding bit periods. Further detail regarding optical amplifier wavelength shifting may be found in U.S. patent application Ser. No. 07/880,728, entitled "Optical Wavelength Shifter" and assigned to the assignee of the present invention, the contents of which are hereby incorporated by reference. It should be noted that in certain applications both the pump and probe signals may be modulated, such that the resulting modulation on the wavelength shifted output is not the complement of the pump signal modulation but is instead a logic function of the pump and probe signal modulations.

A significant limitation in the maximum operating bit rate of the above-described wavelength shifter is the gain recovery time of the optical amplifier. In the semiconductor optical amplifiers typically used for wavelength shifting, the gain recovery time $\tau$ of the amplifier is given approximately by:

$$\tau^{-1} = \tau_{nr}^{-1} + aS,$$

where $$\tau_{nr}^{-1} = 3CN^2 + 2BN.$$

In the above equations, $\tau_{nr}$ is the spontaneous carrier recombination time, which has components caused by Auger recombination and spontaneous emission. C is the Auger recombination coefficient and B is the spontaneous emission coefficent. N is the density of carriers, or electron-hole pairs. S is the internal photon density in the amplifier and a is the stimulated emission rate constant. The spontaneous recombination time is dominated, for InGaAsP optical amplifiers operating near 1.55 $\mu$m, by Auger recombination. See, for example, G. Agrawal and N. Dutta, "Long Wavelength Semiconductor Lasers," Van Nostrand-Reinhold, New York, 1986.

The stimulated emission rate constant a may be expressed as the partial derivative of the semiconductor material gain with respect to the carrier density N within the amplifier. The spontaneous recombination time $\tau_{nr}$ represents spontaneous recombinations of carriers within the amplifier, while the term aS represents stimulated recombinations of carriers with emission of photons. In the typical case, the fall time for the wavelength shifted output signals is relatively short, due to the high photon density S in the amplifier at high pump signal power levels such as those in bit periods T2 and T4 in FIG. 1(b). Thus, when the pump intensity modulation is transitioning to a high level, and shifted signal output is transitioning to a low level, the fall time is typically rapid.

During transitions of the shifted signal output from low to high intensity, however, the pump signal is transitioning from high to low intensity, resulting in a decrease in S and an increase in $\tau$. The rise time of the amplified probe signal modulation may be limited to a value of about 200 to 250 ps for probe signal power levels of less than about $-15.0$ dBm at the amplifier input facet. The rise time of the intensity modulation on the amplified probe signal is thus an important limitation on the operating speed of the wavelength shifter. During the shifted signal rise time, a major contribution toward internal photon density S is the probe input signal power, which in the past has generally been maintained at a power level of less than about $-15.0$ to $-23.0$ dBm at the amplifier input facet to avoid compressing the amplifier gain.

Figure 2:
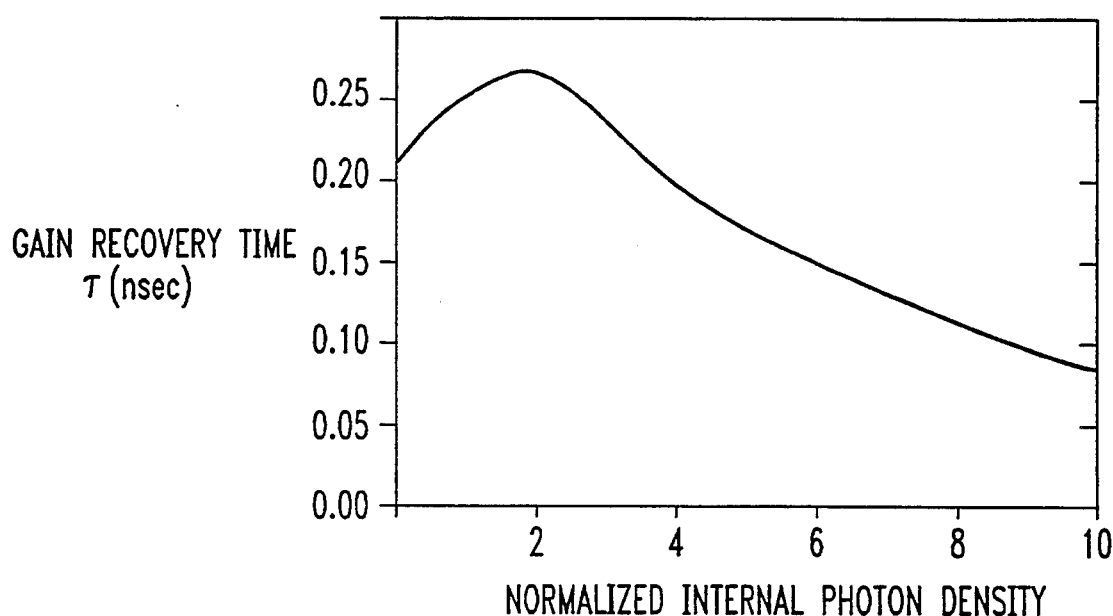
FIG. 2 is a graphical representation of an exemplary variation in optical amplifier gain recovery time as a function of normalized photon density.

FIG. 2 shows an exemplary plot of gain recovery time $\tau$ in nanoseconds, versus internal photon density S normalized to the internal saturation photon density, calculated using the above equations. For this exemplary plot, values of C and B typical of InGaAsP amplifiers at 1.55 $\mu$m are used: $C = 7 \times 10^{-29}$ cm$^6$/s and $B = 0.6 \times 10^-$ cm$^3$/s. Additionally, a bias of 100 mA for a 300 $\mu$m-long device, with a mode-confinement factor of 0.3 and a gain cross-section of $1 \times 10^{-16}$ cm$^2$ are assumed. Carrier density is computed from the standard rate equation and gain is taken proportional to carrier density. See the Agrawal and Dutta reference, cited above. Internal photon density is related to external powers as described in the Agrawal and Dutta reference. Increasing the normalized internal photon density first increases the gain recovery time, as shown in FIG. 2. However, as the photon density is further increased, the gain recovery time can be more than halved. It should be understood that FIG. 2 is the result of a simplified model that neglects bandfilling effects and treats the amplifier as a lumped element, rather than as a distributed element. Neglect of bandfilling may lead to a more rapid decrease of gain recovery time as the photon density is increased. Nevertheless, FIG. 2 shows that increasing internal photon density by increasing the amplifier input power will generally decrease the gain recovery time $\tau$, which will allow for a significant increase in the maximum achievable bit rate of the wavelength shifter.

Figure 3:
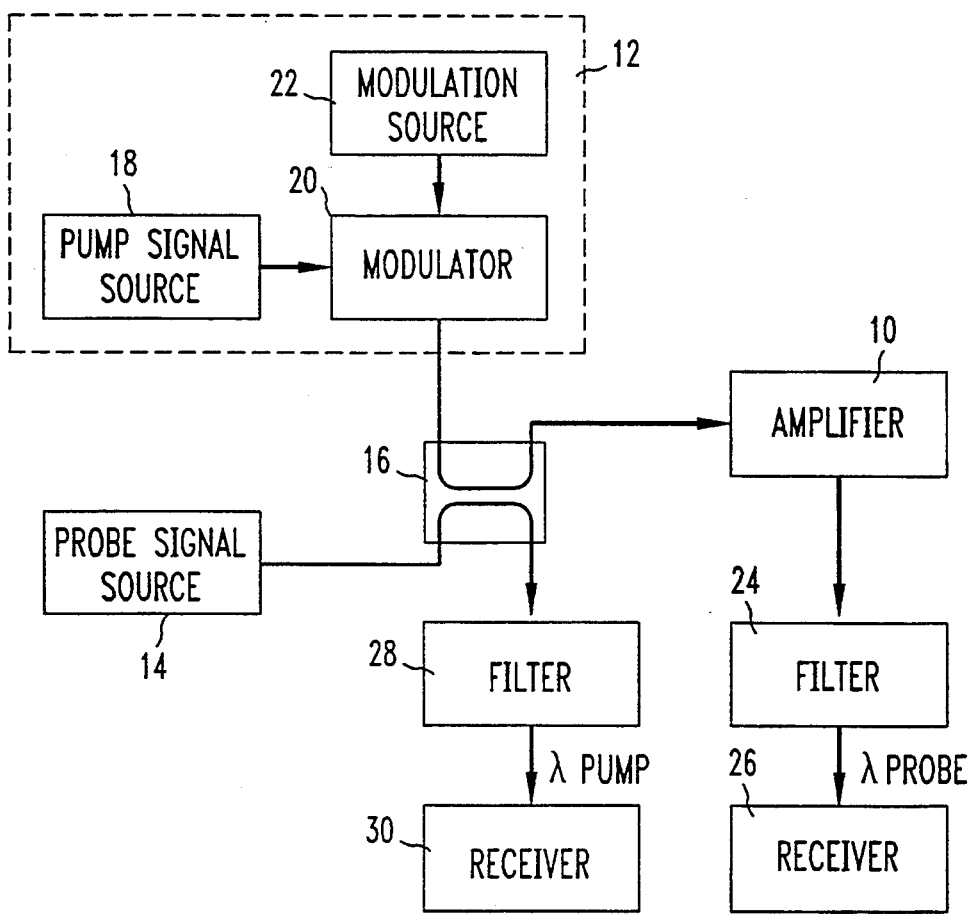
FIG. 3 is a block diagram of an exemplary optical system incorporating a wavelength shifter in accordance with the present invention.

FIG. 3 is a block diagram of an exemplary optical system incorporating an optical amplifier wavelength shifter in accordance with the present invention. The exemplary system includes a semiconductor optical amplifier 10 as a wavelength shifter. The optical amplifier may be a travelling-wave semiconductor amplifier. See T Saitoh and T Mukai, "Recent Progress in Semiconductor Laser Amplifiers," Journal of Lightwave Technology, Vol. 6, No. 11, pp. 1656-1664 (1988). A first optical signal, an intensity-modulated pump signal, is supplied by modulated pump signal source 12, while a second optical signal, an unmodulated CW probe signal, is supplied by probe signal source 14. As noted above, the probe signal may also be modulated in certain applications, such as when the wavelength shifter is used as an optical logic gate. The probe signal source may be followed by an additional optical amplifier such as an erbium-doped fiber amplifier (EDFA), to increase the probe signal power to an appropriate level. The modulated pump and unmodulated probe signals are combined in a coupler 16 and then applied to optical amplifier 10. The coupler 16 may be a 10 to 1 fiber coupler or any other suitable optical signal combiner. The modulated pump signal source 12 includes an unmodulated pump signal source 18, which may be a tunable external cavity semiconductor laser. The output of unmodulated pump source 18 is modulated at a desired bit rate in modulator 20. The modulation is typically a binary digital data stream in an NRZ format, and may be supplied by a modulation source 22. Other modulation signals, such as binary RZ digital data or analog information, could also be used. The modulator 20 may be a LiNbO$_3$ Mach-Zender modulator, or any other suitable optical modulator. An EDFA may be used after the modulator 20 in order to boost the intensity-modulated pump signal power. The intensity modulation on the pump may be ASK modulation or other types of amplitude or intensity modulation.

The pump and probe signals are amplified simultaneously within the optical amplifier 10 to produce an intensity modulation on the probe signal which corresponds to, and is the complement of, that on the pump signal. The amplified probe signal may be filtered in a filter 24 to isolate it from the pump signal and to remove amplified spontaneous emission (ASE) noise from the amplified probe signal output. The filtered probe signal may then be applied to a receiver 26 to demodulate the gain compression-induced intensity modulation. The pump signal may be similarly filtered in filter 28, and supplied to receiver 30. The receivers 26, 30 may include positive-intrinsic-negative (PIN) diode photodetectors to demodulate the optical signal, followed by field effect transistors (FETs) to amplify and impedance-transform the demodulated data signals. It should be understood that the above system is intended to demonstrate the advantages of the present invention, and is not necessarily representative of any preferred optical system application.

In the above exemplary system, the probe signal source 14 may be a distributed Bragg (DBR) laser operating at wavelengths within $+/- 0.02$ $\mu$m of 1.54 $\mu$m. The optical amplifier may be a bulk, polarization-insensitive InGaAsP device. In this exemplary embodiment, the optical amplifier had a 25 dB peak small-signal chip gain at a 1.54 $\mu$m wavelength and 120 mA bias, and a 3 dB compression point output power of about 3.0 to 5.0 dBm, depending upon input signal wavelength. Chip gain refers to gain from the amplifier input facet to the output facet. The 3 dB compression point is defined as that condition for which the amplifier gain is reduced by 3 dB from its relatively constant unsaturated value. Amplifier 3 dB compression can thus be referenced to either an input power or an output power. Although the amplifier may have some small-signal gain ripple, this ripple will generally be suppressed when the amplifier is operated under compressed gain conditions in accordance with the present invention. Alternative optical amplifiers may also be used, including multiple quantum well optical amplifiers with or without strained layers, or amplifiers operating in other wavelength ranges such as those around 1.3 $\mu$m or 0.85 $\mu$m.

In general, an optical amplifier with a high gain is preferred in order to provide maximum extinction ratio in the shifted signal output. It is also preferable that the amplifier have a low saturation output power, such that a smaller pump signal power swing will produce a greater change in amplified probe signal level. Often, amplifiers with high gain will also have a low saturation output power, yielding a further improved output extinction ratio.

The wavelength shifter of the present invention may be implemented as a photonic integrated circuit (PIC). In general, since the improvements of the present invention primarily involve adjusting the power level of the probe signal, rather than altering the optical amplifier itself or adding additional components or hardware, a variety of implementations, including a PIC, may be used. An exemplary PIC may include the optical amplifier, coupler, and filter as well as the probe signal source. Alternatively, the PIC could include the amplifier alone or various combinations of system elements. The PIC could also include additional amplifiers and filters for both the probe and the pump signal inputs.

The method of the present invention includes providing the modulated pump and unmodulated probe signal sources and optical amplifier as described above. The method further includes the steps of applying the pump and probe signals to the optical amplifier, and simultaneously amplifying the signals therein. The improvement of the present invention involves the additional step of adjusting the probe signal power applied to the optical amplifier in order to reduce a transition time of the intensity modulation induced on the amplified probe signal. The step of adjusting the probe signal power level may be performed in a variety of ways, including calculating a desired probe power increase necessary to increase amplifier internal photon density to achieve a desired reduction in gain recovery time in accordance with the above equations. As one alternative, the probe signal power may be manually or automatically adjusted in an actual system until a desired rise time or system performance is achieved.

In general, the adjustment of probe signal power level will involve increasing probe signal power at least to a value which will compress the amplifier gain by about 3.0 dB in the absence of a pump signal, and more typically to a level which will compress amplifier gain by about 6.0 to 8.0 dB or more. Thus, the amplifier will generally be operated with a probe signal input power above the amplifier's 3 dB compression point input power. However, it should be noted that lesser increases in probe signal input power levels, but above the approximately −15.0 dBm at the input facet in typical prior art shifters, may be used to increase bit rate capacity by reducing amplifier gain recovery time in accordance with the present invention. The amount of probe signal power increase will typically be a function of desired bit rate, with larger increases in probe signal power generally appropriate for achieving higher bit rates. The increase in probe signal power level may be limited by a desired output extinction ratio. However, the probe signal power level may be increased to a level equivalent to or greater than the pump signal power in order to achieve a desired level of system performance.

As mentioned above, one or more additional probe signals could be input into the optical amplifier with a modulated pump to place the complement of the pump modulation signal on each of the additional probe signals. These additional unmodulated probe signals may each have a different wavelength, resulting in additional amplified intensity-modulated probe signals at the optical amplifier output. When several CW probe signals are used, the relevant probe signal power level for reducing the shifted probe signal rise time will typically be the sum of the input probe signal powers. Thus, the adjustment of probe signal power will involve the adjustment of the sum of the probe signal input power to at least a value which will compress the amplifier gain by about 3 dB in the absence of pump signal, and more typically to a level which will compress the amplifier gain by about 6.0 to 8.0 dB or more.

The method of the present invention was applied to the exemplary optical system of FIG. 3. An optical amplifier 10 as described above was used as a wavelength shifter. The exemplary amplifier was packaged with microlensed-fiber pigtails, with a coupling loss of about 6 dB at each facet. An intensity-modulated pump signal input average power of about 0.0 to 2.0 dBm was used, as measured in the fiber before the microlens. This corresponds to a pump signal average power of about −6.0 to −4.0 dBm at the amplifier input facet. The probe signal power levels discussed below are also measured in the fiber, and therefore the probe signal power at the input facet is about 6 dB lower than the stated measured values. The bit error rate (BER) of both the amplified probe and the input pump signal were measured after demodulation in optical receivers 26, 30 respectively. All of the measurements described herein were performed using a pseudo-random bit sequence of length $2^{23}$-1. The probe signal wavelength and power level were adjusted as will be described in greater detail below.

Figure 4A:
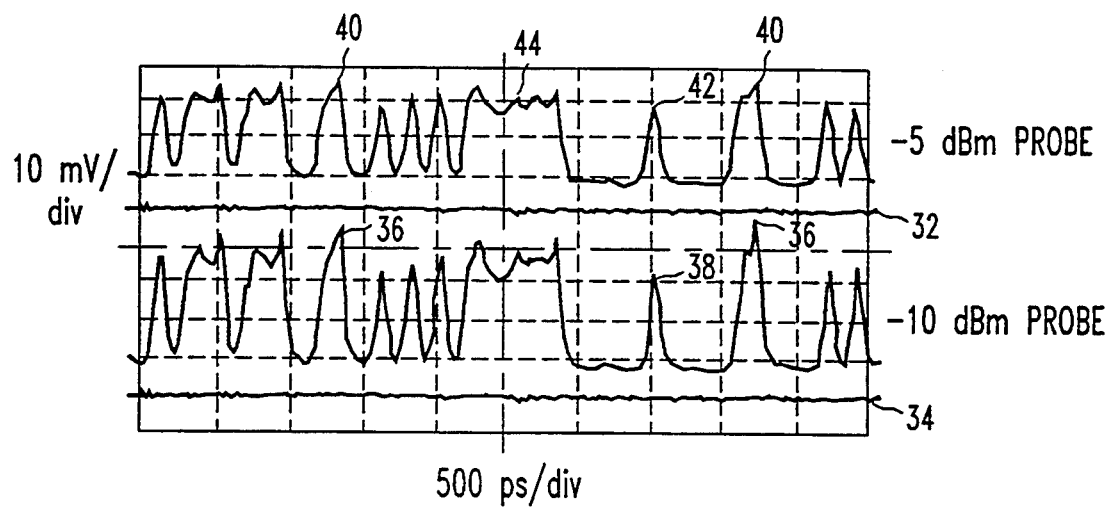
FIG. 4(a) illustrates the variation in a portion of an exemplary demodulated pseudo-random bit sequence as a function of probe signal power level in accordance with the present invention.

In a first example of the improved wavelength shifter performance provided by the present invention, the probe signal source was configured to effect a wavelength shift from a pump signal wavelength of 1.546 μm to a longer probe wavelength of 1.552 μm. System performance was measured for probe input powers of −5.0 and −10.0 dBm, as measured in fiber before the amplifier. A comparison of the demodulated probe signal intensity modulation is shown in FIG. 4(a). The demodulated signals or data streams shown were measured with a 26 GHz bandwidth PIN diode photodetector in receiver 26, and displayed on a 40 GHz bandwidth sampling oscilloscope. The zero intensity level for each data stream shown is indicated by reference numbers 32, 34, respectively. It can be seen that at a lower probe signal power of −10.0 dBm, measured in the fiber before the amplifier, the height of an isolated logic high level or mark 38 shows a greater amplitude variation when compared to pairs of marks 36 due to slower gain recovery time in the optical amplifier. This variation will also contribute to a degradation in other measures of system performance, such as receiver eye diagrams or bit error rate. For a probe signal power level of −5.0 dBm, the height variation of an isolated mark 42, as compared to pairs of marks 40 and strings of marks 44, is reduced. The extinction ratio of the received modulation signal has a value of about 3.0 to 3.5 for a probe power level of −10.0 dBm and a value of about 3.0 for a probe power level of −5.0 dBm.

This reduction in extinction ratio is expected because at higher probe signal powers, the amplifier gain begins to saturate in the absence of the pump signal, resulting in less of a gain difference $G_1-G_2$ for high and low intensity modulation levels of the pump signal. The extinction ratio penalty Δ arising from probe signal compression of the amplifier gain is given by:

$$\Delta = 10\log_{10}\left[\frac{(1 + r)}{(1 - r)}\right]$$

where r is the reciprocal extinction ratio, corresponding to the ratio of space power to mark power in the demodulated signal. For the demodulated signal of FIG. 4(a) corresponding to a probe power of −5.0 dBm, Δ is about 3 dB. For the probe power of −10.0 dBm, assuming an extinction ratio of 3.5, Δ=2.6 dB. Thus the power penalty caused by the degradation in extinction ratio arising from the use of a −5.0 dBm probe power instead of a −10.0 dBm probe power is 3.0 dB−2.6 dB=0.4 dB. This is the system performance penalty which will result from increasing the probe signal power by 5 dB in the exemplary system shown. However, the optical system is now capable of operating at bit rates of 10 Gbits/s or more with no error floor.

An additional effect which should be noted is the probe signal wavelength dependence of the pump-induced compression. Because of bandfilling effects, when the probe signal wavelength is shorter than the pump signal wavelength, a given pump signal power typically reduces the gain more than when the probe signal wavelength is longer than the pump signal wavelength. This occurs in general because the pump signal reduces the carrier density in the amplifier active region by stimulated emission. The reduced density of carriers fills the bottom of the semiconductor amplifier conduction band, thus lowering the Fermi level and reducing the carrier density at higher energy states in the conduction bank corresponding to shorter wavelengths. This is known as bandfilling. This reduces the gain in the higher energy states and consequently reduces the gain for shorter wavelength probe signals. This effect is manifested for the exemplary wavelength shifter considered here as larger extinction ratio penalties when the probe wavelength is longer than the pump wavelength, as compared to the case of the probe wavelength shorter than the pump wavelength.

Figure 4B:
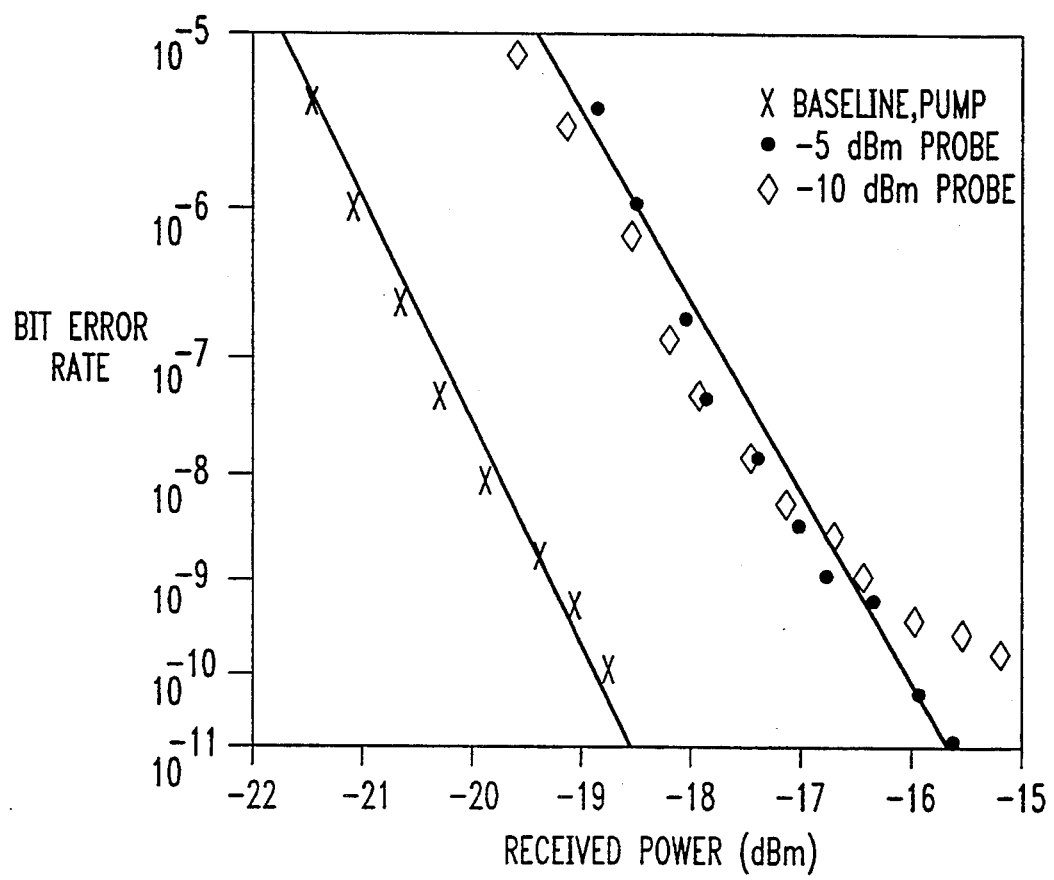
FIG. 4(b) is a plot of optical system performance for wavelength shifting of an intensity-modulated optical signal from 1.546 $\mu$m to 1.552 $\mu$m at a bit rate of 10.0 Gbits/s in accordance with the present invention.

FIG. 4(b) illustrates the BER performance of the exemplary optical system of FIG. 3 when operated at 10 Gbits/s to shift an optical signal wavelength from 1.546 μm to 1.552 μm. A baseline curve, with each data point indicated by an x, shows the performance obtained without any wavelength shifting of the pump signal. For wavelength shifting at a probe power level of about −10.0 dBm measured in the fiber, in the curve with data points indicated by diamonds, a penalty of at least 3.0 dB is seen. More significantly, the BER curve also exhibits a deviation from linear performance and has an error rate floor of about $10^{-10}$. Thus, regardless of the strength of the received signal, no reduction in bit error rate below $10^{-10}$ can be achieved at a probe power level of −10 dBm at 10 Gbits/s bit rates. For wavelength shifting at a power level adjusted to −5.0 dBm in accordance with the present invention, the BER curve with data points indicated by circles is obtained. Although the curve has about a 0.4 dB larger penalty for error rates down to about $10^{-9}$, the curve is linear and does not exhibit an error rate floor. System performance has therefore been improved by making the probe signal power level adjustment.

Figure 5:
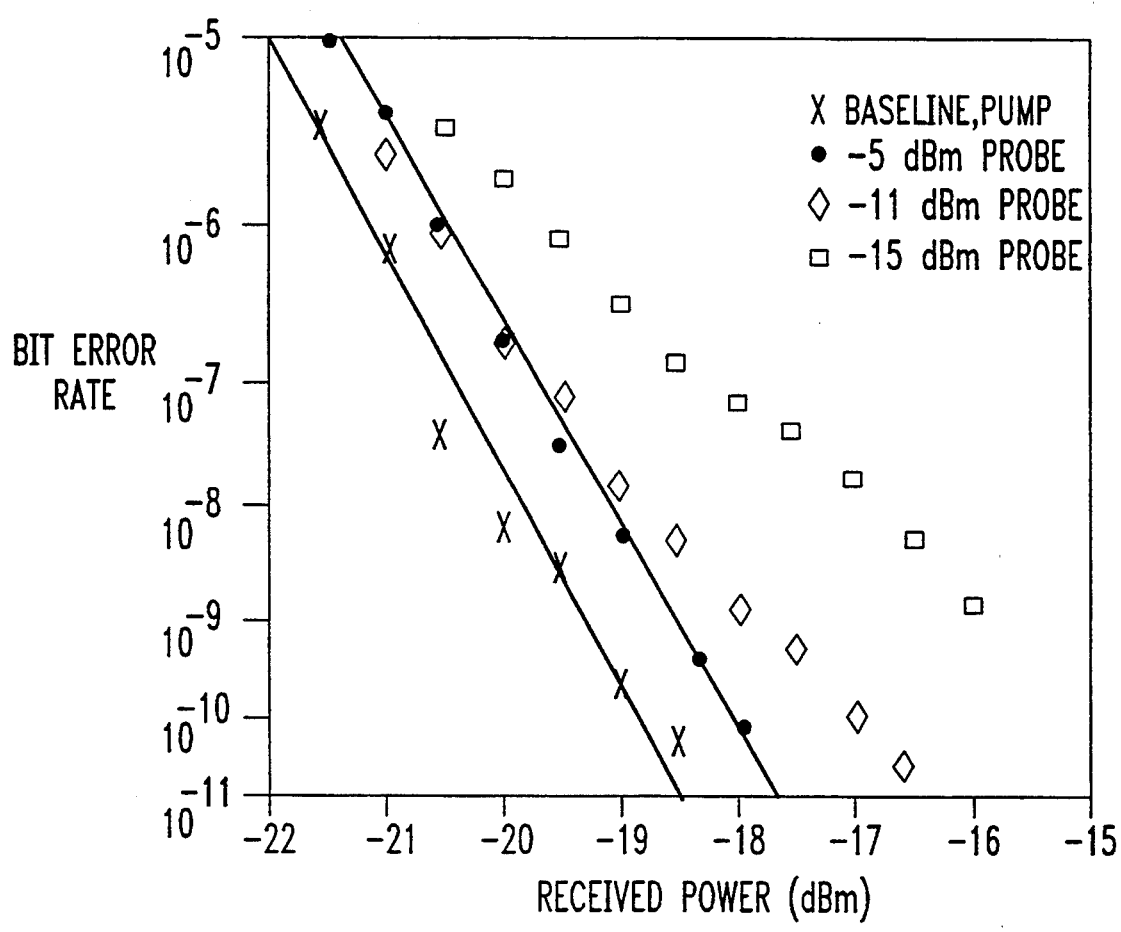
FIG. 5 is a plot of optical system performance for wavelength shifting of an intensity-modulated optical signal from 1.546 $\mu$m to 1.531 $\mu$m at 10 Gbits/s in accordance with the present invention.

In FIG. 5, measurement data is shown corresponding to a second example of the improved performance provided by the present invention. In this example, a 1.546 μm intensity-modulated pump signal was wavelength shifted to a shorter wavelength using a probe signal wavelength of 1.531 μm. At low probe signal input powers of −15.0 and −10.0 dBm, again as measured in the fiber, the resulting BER curves deviate from linear and tend toward an error rate floor. At a probe signal power of −5.0 dBm, the BER curve is linear and exhibits no error rate floor. The extinction ratio penalty resulting from the wavelength shift, compared to the baseline curve for an unshifted pump, is about 0.8 dB. The extinction ratio penalty is reduced in the case of shorter wavelength probe signals due to the bandfilling effect, which results in more efficient reduction in amplifier gain for the shorter wavelength probe signal at high pump signal levels, as described previously. The BER curves corresponding to probe signal power levels of −11.0 and −15.0 dBm indicate the performance degradation from longer amplifier gain recovery time and resulting longer rise times in the amplified probe signal. The longer gain recovery and rise times create increased intersymbol interference (ISI) between adjacent data bits which is reflected in the BER curve degradation.

Figure 6:
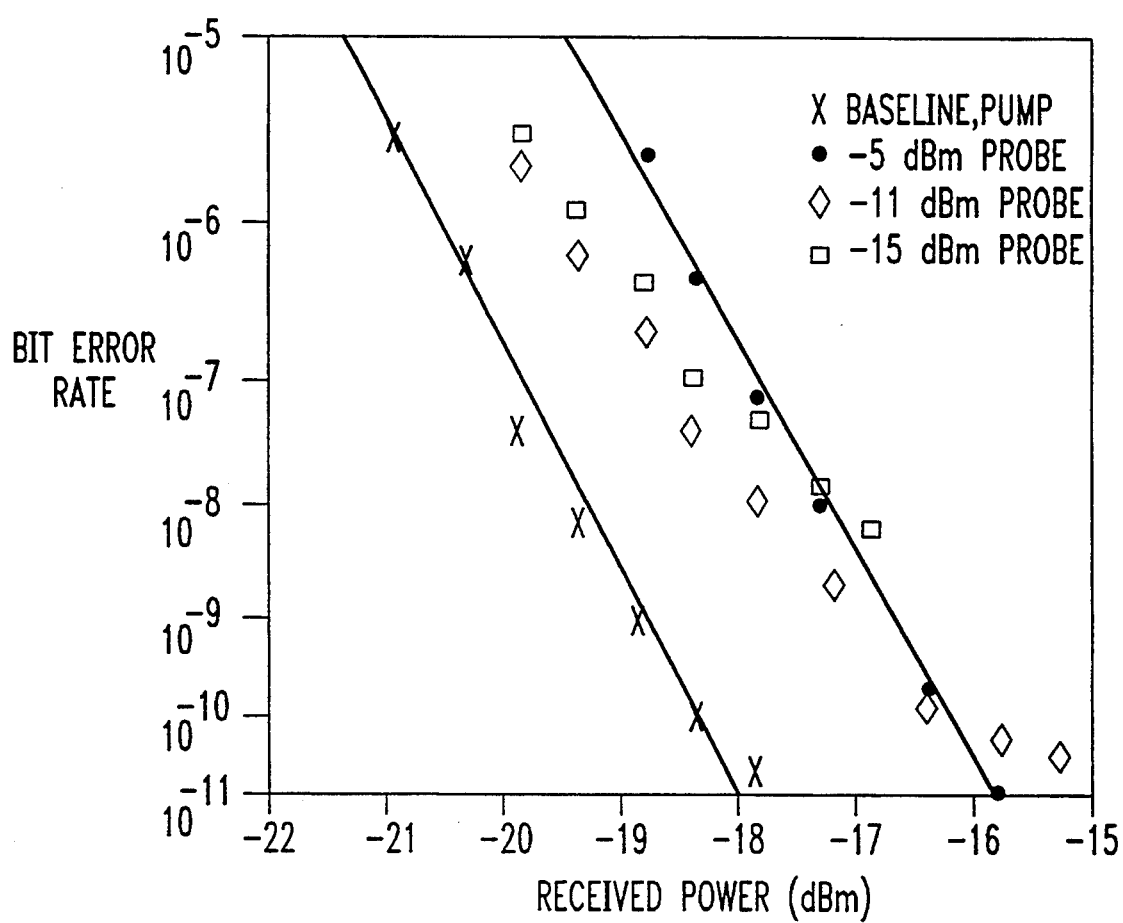
FIG. 6 is a plot of optical system performance for wavelength shifting of an intensity-modulated optical signal from 1.535 $\mu$m to 1.552 $\mu$m at 10 Gbits/s in accordance with the present invention.

FIG. 6 illustrates data obtained in a third example of the improved wavelength shifter performance provided by the present invention. The data of FIG. 6 were measured using the optical system of FIG. 3 to wavelength shift an optical signal by 17 nm to a longer wavelength using a pump signal at a wavelength of 1.535 μm and a probe signal at a wavelength of 1.552 μm. The BER curve for a probe signal power level of −5.0 dBm is linear and has no apparent error floor. The BER curves for probe power levels of −11.0 and −15.0 dBm, on the other hand, deviate from linear, and have error rate floors of about $10^{-11}$ and about $10^{-9}$ to $10^{-10}$, respectively, indicating performance degradation arising from longer gain recovery times and resulting ISI.

The data illustrated in FIGS. 4, 5 and 6 indicate that, in accordance with the present invention, wavelength shifting in optical amplifiers may be performed at bit rates of 10 Gbits/s or higher. The wavelength shifting may be either to a longer or to a shorter wavelength. As previously noted, bandfilling effects may result in a reduced extinction ratio penalty in shifting to a shorter wavelength as compared to shifting to a longer wavelength. Wavelength shifting is possible over a range of wavelengths substantially corresponding to the gain bandwidth of the optical amplifier. For the exemplary optical amplifier used in the above described examples, the gain bandwidth was about 50 nm. The exemplary probe signal power level of −5.0 dBm used above compressed the amplifier gain by about 7 dB. However, other probe signal power levels could also be used to improve wavelength shifter performance in accordance with the present invention. Generally, it is desirable to compress the amplifier gain by at least 3 dB and typically about 6.0 to 8.0 dB or more to obtain an appreciable improvement in gain recovery and rise times. The probe signal power level should therefore generally be increased to a level which compresses the amplifier gain by at least 3 dB. This power level is referred to as the amplifier 3 dB compression point input power, and will generally vary depending upon the type of optical amplifier used, amplifier bias level, input signal wavelength, and input signal polarization if the optical amplifier is not polarization independent.

For a given input probe power level, there may be a range of optimal pump input power levels which will minimize the extinction ratio penalty for optical amplifier wavelength shifting. For the exemplary system discussed above, with a probe input power level of −4.0 dBm, as measured in fiber before the amplifier, the optimal pump input power level is about 0.0 to 1.0 dBm, also measured in fiber. When the pump signal power level is increased or decreased from this level by 2 dB, there may be about a 0.5 dB power penalty at a $10^{-9}$ bit error rate. This generally occurs because extinction ratio is degraded when the pump signal power is too low, and the amplifier gain is not modulated as deeply as possible by the pump signal. Conversely, when the pump power is too high, the overall gain level of the amplifier is reduced by gain compression and the gain variation which modulates the probe is reduced. At a probe input power of −6.0 dBm measured in fiber, an optimal pump input power measured in fiber may be about −4.0 dBm, with a power penalty of about 0.5 dB at a $10^{-9}$ bit error rate for a change in pump power of about 2 dB. A larger power penalty, on the order of 1.5 dB, may result for a 2 dB reduction in probe input power, due to the ISI problems discussed above.

While the foregoing detailed description was primarily directed to wavelength shifting in a semiconductor optical amplifier using a modulated pump signal and an unmodulated probe signal, it should again be emphasized that the embodiments and applications discussed are exemplary only. The wavelength shifter of the present invention may be used as an optical switch, demultiplexer, tap or logic gate, as well as in other optical applications. Many different variations, including type of optical amplifier, number and wavelength of input signals used, pump and probe signal power levels, and type of pump and/or probe signal modulation may be made to suit the needs of a given application. These and other alternatives and variations in the arrangements shown will be readily apparent to those skilled in the art, and the present invention is therefore limited only by the appended claims.

I claim:

1. A method of producing corresponding intensity variations from an intensity-modulated first optical signal at a first wavelength on a second optical signal at a second wavelength, said method comprising the steps of:
applying said first and said second optical signals to an optical amplifier having a gain which varies with an intensity of said intensity-modulated first optical signal; and
amplifying said first and said second optical signals in said optical amplifier such that variations in said intensity of said intensity-modulated first optical signal alter said gain of said optical amplifier to produce an amplified intensity-modulated second optical signal with said corresponding intensity variations;
wherein a power level of said second optical signal applied to said optical amplifier is selected as greater than or equal to a 3 dB compression point input power of said optical amplifier.

2. The method of claim 1 further including the steps of:
providing at least one additional optical signal; and
applying said additional optical signal to said optical amplifier with said first and said second optical signals to produce an amplified intensity-modulated additional signal having said corresponding intensity variations.

3. The method of claim 2 further including the step of selecting a power level of said additional signal to reduce a transition time of said corresponding variations in intensity of said amplified intensity-modulated additional optical signal.

4. The method of claim 1 wherein said first wavelength is longer than said second wavelength.

5. The method of claim 1 wherein said first wavelength is shorter than said second wavelength.

6. The method of claim 1 further including the step of combining said first and said second optical signals in an optical coupler prior to said step of applying said first and said second optical signals to said optical amplifier.

7. The method of claim 1 further including the step of filtering an output of said amplifier to separate said amplified intensity-modulated second optical signal from said intensity-modulated first optical signal.

8. The method of claim 1 wherein said step of amplifying said first and second optical signals includes amplifying the signals in a travelling-wave semiconductor optical amplifier.

9. An apparatus for producing corresponding intensity variations from an intensity-modulated first optical signal at a first wavelength on a second optical signal at a second wavelength, comprising:
an optical amplifier having a gain which varies with an intensity of said intensity-modulated first optical signal, said optical amplifier receiving and amplifying said first and said second optical signals such that variations in said intensity of said intensity-modulated first optical signal alter said gain of said optical amplifier to produce an amplified intensity-modulated second optical signal with said corresponding intensity variations, wherein a power level of said second optical signal applied to said optical amplifier is selected as greater than or equal to a 3 dB compression point input power of said optical amplifier.

10. The apparatus of claim 9 wherein said first wavelength is longer than said second wavelength.

11. The apparatus of claim 9 wherein said first wavelength is shorter than said second wavelength.

12. The apparatus of claim 9 further including an optical coupler for combining said first and said second optical signals before said first and said second optical signals are amplified in said optical amplifier.

13. The apparatus of claim 9 further including a filter to separate said amplified intensity-modulated second optical signal from said intensity-modulated first optical signal.

14. The apparatus of claim 9 wherein said optical amplifier is a travelling-wave semiconductor optical amplifier.

15. The apparatus of claim 9 wherein said optical amplifier and a source of said second optical signal are implemented as a photonic integrated circuit.

16. The method of claim 1 wherein the step of amplifying the first and second optical signals further includes amplifying the first and second signals as the first and second signals co-propagate in the optical amplifier.

17. The apparatus of claim 12 wherein the first and second optical signals co-propagate in the optical amplifier.

18. In an optical system in which an intensity-modulated first optical signal at a first wavelength is converted to a second wavelength, a method comprising the steps of:
providing a second optical signal at the second wavelength; and
amplifying the first and second optical signals in an optical amplifier such that the intensity modulation on the first optical signal produces corresponding modulation on the second optical signal, wherein a power level of the second optical signal is selected as greater than or equal to a 3 dB compression point input power of the amplifier.

19. The method of claim 18 wherein the step of amplifying the first and second optical signals further includes amplifying the signals such that variations in the intensity of the intensity-modulated first signal alter the gain of the optical amplifier to produce corresponding intensity variations in the second signal.

20. In an optical system in which an intensity-modulated first optical signal at a first wavelength is converted to a second wavelength, an apparatus comprising:
a source providing a second optical signal at the second wavelength; and
an optical amplifier adapted to receive and amplify the first and second optical signals such that the intensity modulation on the first optical signal produces corresponding modulation on the second optical signal, wherein a power level of the second optical signal is selected as greater than or equal to a 3 dB compression point input power of the amplifier.

21. The apparatus of claim 20 wherein variations in the intensity of the intensity-modulated first signal alter the gain of the optical amplifier to produce corresponding intensity variations in the second signal.

22. In an optical system in which an intensity-modulated first optical signal at a first wavelength is converted to a second wavelength, a method comprising the steps of:
providing two or more additional optical signals, with at least one of the additional optical signals at the second wavelength; and amplifying the first optical signal and the additional optical signals in an optical amplifier such that the intensity modulation on the first optical signal produces corresponding modulation on the second optical signal, wherein power levels of the additional optical signals are selected such that a sum of the input power levels of the additional signals is greater than or equal to a 3 dB compression point input power of the amplifier.

23. The method of claim 22 wherein the additional signals include a second optical signal at the second wavelength and a third optical signal.

24. In an optical system in which modulation corresponding to intensity variations in an intensity-modulated first optical signal at a first wavelength is produced on a second optical signal at a second wavelength, a method comprising the step of:

amplifying said first and said second optical signals in an optical amplifier such that the intensity variations in the intensity-modulated first optical signal produce the corresponding modulation on the second optical signal;

wherein a power level of said second optical signal at an input of the optical amplifier is selected to increase the amplifier internal photon density when the first optical signal is at or below a low intensity level, such that a gain recovery time in the amplifier is reduced by at least a factor of two relative to a maximum gain recovery time in the amplifier when the first optical signal is at or below a low intensity level.

25. The method of claim 24 wherein the step of amplifying the first and second optical signals further includes simultaneously amplifying the first and second optical signals with at least one additional optical signal.

26. In an optical system in which modulation corresponding to intensity variations in an intensity-modulated first optical signal at a first wavelength is produced on a second optical signal at a second wavelength, a method comprising the step of:

amplifying said first and said second optical signals in an optical amplifier with at least one additional optical signal such that the intensity variations in the intensity-modulated first optical signal produce the corresponding modulation on the second optical signal;

wherein a sum of power levels of said second optical signal and said additional optical signals at an input of the optical amplifier is selected to increase the amplifier internal photon density when the first optical signal is at or below a low intensity level, such that a gain recovery time in the amplifier is reduced by at least a factor of two relative to a maximum gain recovery time in the amplifier when the first optical signal is at or below a low intensity level.

* * * * *